United States Patent [19]

Harra

[11] Patent Number: 4,512,391
[45] Date of Patent: Apr. 23, 1985

[54] APPARATUS FOR THERMAL TREATMENT OF SEMICONDUCTOR WAFERS BY GAS CONDUCTION INCORPORATING PERIPHERAL GAS INLET

[75] Inventor: David J. Harra, Santa Cruz, Calif.

[73] Assignee: Varian Associates, Inc., Palo Alto, Calif.

[21] Appl. No.: 343,794

[22] Filed: Jan. 29, 1982

[51] Int. Cl.³ .................... F28F 7/00; F28D 15/00
[52] U.S. Cl. .................... 165/48 R; 118/69; 118/725; 165/80 C; 165/104.32; 165/126
[58] Field of Search ............. 118/724, 725, 728, 730, 118/69; 204/298; 250/492.2; 165/48 R, 139, 126, 80 R, 80 A, 80 C, 80 E, 104.11, 104.32, 104.33

[56] References Cited

U.S. PATENT DOCUMENTS

| | | | |
|---|---|---|---|
| 3,062,507 | 11/1972 | Andrus | 257/212 |
| 3,190,262 | 6/1965 | Bakish et al. | 118/725 X |
| 3,421,331 | 1/1969 | Higa | 62/6 |
| 3,430,455 | 3/1969 | Stuart et al. | 62/383 |
| 3,525,229 | 8/1970 | Denhoy | 62/55.5 |
| 3,566,960 | 3/1971 | Stuart | 165/104.31 |
| 3,717,201 | 2/1973 | Hosmer | 165/96 |
| 3,717,439 | 2/1973 | Sakai | 118/725 X |
| 3,785,853 | 1/1974 | Kirkman et al. | 118/730 X |
| 3,854,443 | 12/1974 | Baerg | 118/724 |
| 3,993,123 | 11/1976 | Chu et al. | 165/80 C |
| 4,063,974 | 12/1977 | Fraas | 118/725 X |
| 4,261,762 | 4/1981 | King | 148/1.5 |
| 4,282,924 | 9/1981 | Faretra | 165/80 |
| 4,306,731 | 12/1981 | Shaw | 279/4 |

OTHER PUBLICATIONS

M. King, et al., "Experiments on Gas Cooling of Wafers", Proceedings Third International Conference on Ion Implantation Equipment and Techniques, Queens University, Kingston, Ontario (May, 1980), Published in Nuclear Instruments and Methods 189 (1981), pp. 169-173, North-Holland Pub. Co.

L. D. Bollinger, "Ion Milling for Semiconductor Production Processes", Solid State Technology, Nov. 1977, pp. 66-70.

S. Dushman et al., "Thermal Conductivity at Low Pressures", *Scientific Foundations of Vacuum Technique,* pp. 43-53, (1962).

Primary Examiner—Douglas Hart
Attorney, Agent, or Firm—Stanley Z. Cole; Norman E. Reitz

[57] ABSTRACT

An apparatus for the uniform thermal treatment of semiconductor wafers by gas conduction holds the wafer in place over a gas filled cavity in opposition to a thermal mass maintained at an appropriate temperature. Gas is introduced behind the semiconductor wafer adjacent its periphery to produce a near-constant gas pressure across the backside of the wafer. The constant pressure produces constant thermal conductivity. Consequently, heat conduction is uniform, the temperature of the wafer is uniform and uniform processing is accomplished across the wafer.

12 Claims, 5 Drawing Figures

APPARATUS FOR THERMAL TREATMENT OF SEMICONDUCTOR WAFERS BY GAS CONDUCTION INCORPORATING PERIPHERAL GAS INLET

DESCRIPTION

This invention relates to apparatus for the thermal treatment of semiconductor wafers by gas conduction and, more particularly, relates to apparatus for obtaining the highly uniform thermal treatment of semiconductor wafers by gas conduction wherein gas is introduced adjacent the periphery of the wafer.

In the processing of semiconductor wafers, e.g., in order to fabricate integrated circuits, it sometimes occurs that wafers are subjected to elevated temperatures. For the diffusion of impurities, the growth of epitaxial layers, the application of high quality metal films or annealing of metal semiconductor contacts, and the like, such elevated temperatures are desirable. In these situations, it is desirable to apply thermal energy in a controlled and uniform manner. For other applications, such as ion implantation and etching, thermal energy is an unwanted byproduct. In these applications, it may be undesirable to expose the wafer to elevated temperatures since, for example, gratuitous diffusion beyond prescribed limits, as well as the segregation of impurities at epitaxial interfaces is not desired. Also, intermediate photoresist layers may be affected at elevated temperatures. This problem is enhanced in the fabrication of large scale integration (LSI) and very large scale integration (VLSI) devices since a large number of processing steps must be used in sequence; in particular, near the end of the processing sequence there are large numbers of impurities, conducting layers or insulating layers in place and it is not desirable to disturb these physical features by thermal treatment. In these situations, one wants to cool the semiconductor wafers in a controlled and uniform manner. Thus, it is desired to raise semiconductor wafers to elevated temperatures when a process step positively requires it and, to the contrary, to cool a semiconductor wafer to prevent elevated temperatures from being attained when unwanted heat is generated.

Previous approaches to heating semiconductor wafers have included the resistive heating of platens on which wafers are placed, the infrared heating of the exposed surface of wafers, the inductive heating of wafers placed on susceptors or convective heating by a preheated gas stream. These approaches have not been wholly satisfactory because the rate of heating is often too slow, the temperature distribution across the wafer is often highly non-uniform, and control of the equilibrium temperature of the wafer is often not feasible in a production environment.

Previous attempts to cool semiconductor wafers which are undergoing etching or ion implantation include producing intermittent exposure by scanning either or both the ion beam of the wafer (thereby limiting throughput), providing an actively cooled metal plate, coated with grease or oil, for the semiconductor wafer to rest upon, or applying an electrostatic force to hold a wafer against a slightly compressible surface on an actively cooled plate. See, e.g., L. D. Bollinger, "Ion Milling for Semiconductor Production Processes", Solid State Technology, November 1977. These prior art techniques and devices have proven to not be wholly effective at cooling semiconductor wafers when high ion fluxes or energy levels are experienced. A convexly curved platen to which a semiconductor wafer is clamped is disclosed in R. A. Faretra, U.S. Pat. No. 4,282,924, "Apparatus for Mechanically Clamping Semiconductor Wafer Against Pliable Thermally Conductive Surface". The cooling efficiency of this apparatus is limited by the extent to which the backside of the wafer actually contacts the thermally conductive surface since, at the atomic level, only small areas of the two surfaces (typically less than 5%) actually come in contact.

The technique of gas conduction is known to permit efficient thermal coupling between two opposed surfaces. The technique has been widely employed. For example, in O. E. Andrus, "Multi-Layer Vessel Having a Heat Transfer Material Disposed Between Layers", U.S. Pat. No. 3,062,507, gas (or liquid) is placed between layers of a vessel to obtain optimum heat transfer. For a discussion of heat transfer switching in cryogenic pumps, see, e.g., B. S. Denhoy, U.S. Pat. No. 3,525,229, "On-Off Thermal Switch for a Cryopump"; T. P. Hosmer, U.S. Pat. No. 3,717,201, "Cryogenic Thermal Switch"; R. W. Stuart, et al., "Thermal Switch for Cryogenic Apparatus", U.S. Pat. No. 3,430,455; and W. H. Higa, U.S. Pat. No. 3,421,331, "Refrigeration Apparatus". In each case thermal transfer between opposed surfaces is obtained by gas conduction. In R. V. Stuart, "Cooling Apparatus for Vacuum Chamber", U.S. Pat. No. 3,566,960, the problem of inadequate contact between solid surfaces is discussed (see column 3, line 2 et. seq.) and a gaseous medium to conductively cool the workpiece in the vacuum chamber is illustrated. In the same vein, gas conduction cooling of a workpiece in a vacuum is shown in M. King and P. H. Rose, "Experiments on Gas Cooling of Wafers", Proceedings, Third International Conference on Ion Implantation Equipment and Techniques, Queens University, Kingston, Ontario (May, 1980), published in Nuclear Instruments and Methods 189 (1981) 169–173 by North-Holland Publishing Co., and in M. King, U.S. Pat. No. 4,261,762, "Method of Conducting Heat to or From an Article Being Treated Under Vacuum". In this apparatus, gas is introduced into the middle of a cavity behind a semiconductor wafer. Thermal coupling is achieved through the gas to the main body of the apparatus as typically accomplished in the gas conduction art. In practice, however, there is a finite leakage rate due to imperfect seals so that a pressure gradient exists between the middle of the cavity and the periphery. Since the heat conductivity in a gas is proportional to pressure, more heat is transferred at the center where a higher pressure exists and a temperature gradient exists across the wafer. For certain processes, such as metal coating, this temperature gradient leads to non-uniform processing which may be undesirable.

It is therefore an object of the present invention to provide apparatus for holding and thermally treating semiconductor wafers which produces a uniform thermal transfer by gas conduction.

It is a further object of the present invention to provide an apparatus which introduces thermal transfer gas behind a semiconductor wafer and around its periphery, adjacent any points of leakage, so that no pressure gradient exists across the back side of the wafer.

It is another object of the present invention to provide an apparatus for uniform thermal treatment of a semiconductor wafer by gas conduction coupling.

BRIEF DESCRIPTION OF THE DRAWINGS

For a more complete understanding of the present invention, reference may be had to the drawings which are incorporated herein by reference, and in which.

SUMMARY OF THE INVENTION

An apparatus for the uniform thermal treatment of semiconductor wafers by gas conduction holds the wafer in place over a gas filled cavity in opposition to a thermal mass maintained at an appropriate temperature. Gas is introduced behind the semiconductor wafer adjacent its periphery. A near-constant gas pressure is thus maintained across the backside of the wafer since there are no sources or sinks except adjacent the periphery. Consequently, heat conduction is uniform, temperature is uniform and uniform processing is accomplished across the wafer.

DESCRIPTION OF THE PREFERRED EMBODIMENTS

Figure 1:
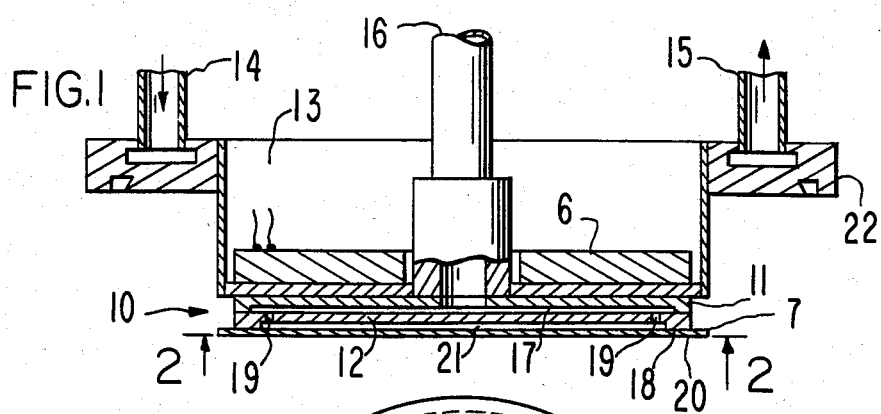
FIG. 1 is a side cross-sectional view of the apparatus of the present invention.
Figure 2:
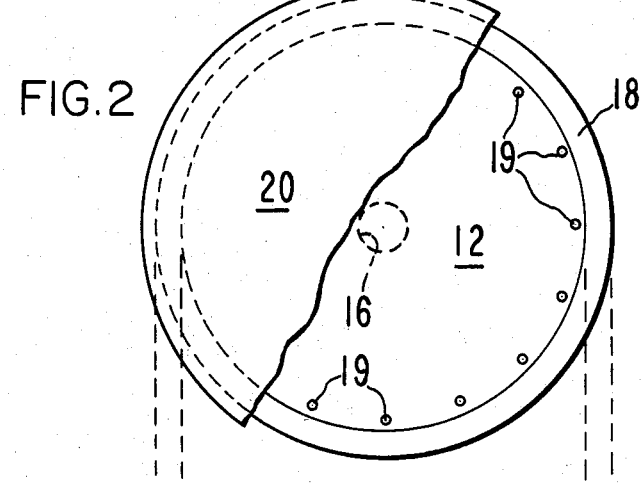
FIG. 2 is a plan view of the apparatus of the present invention.

By reference to FIGS. 1 and 2 it can be seen that gas conduction cooling apparatus 10 comprises a body 13 which is actively cooled by flowing coolant through an interior cooling channel network in flange 22 having an externally accessible inlet 14 and outlet 15. Body 13 is also susceptible to active heating by means of heater 6. Body 13, preferably fabricated from stainless steel, contains a conduit 16 for the introduction of a gas to the working region where a semiconductor wafer is held in place. This conduit is shown to be centrally placed within body 13, although with the apparatus of the present invention, central placement is not necessary. Plate 11 forms the edge of body 13 and affixed thereto with a slight displacement is plate 12 both of which are fabricated preferably of copper or aluminum. The lower face of plate 12 forms an end face of body 13, which end face serves to transfer heat to or from a substrate 20 by gas conduction. Plates 11 and 12 are intimately affixed to each other and to body 13 by brazing to assure high heat conductivity and good temperature uniformity. The displacement between plates 11 and 12 defines a cavity 17 into which gas is introduced from channel 16. Cavity 17 is shown in FIG. 1 to be fully open in the particular sectional view taken. However, to avoid creating a thermal barrier between body 13 and plate 12 through cavity 17, in one embodiment radial conduits extend from a central channel 16 to an annular ring cavity underneath openings 19. Thus, a large portion of the volume between plate 11 of body 13 and plate 12 is filled with an extension of plate 11 to facilitate thermal transfer. The radial conduits and annular cavity are sized large enough to provide sufficient gas conductance and small enough to permit adequate thermal transfer.

Figure 3:
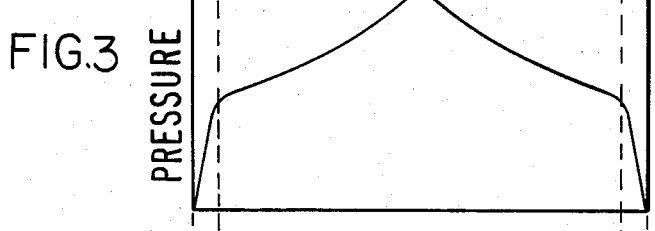
FIG. 3 is a graph showing the gas pressure behind the wafer in a gas conduction cooling apparatus of the prior art.
Figure 4:
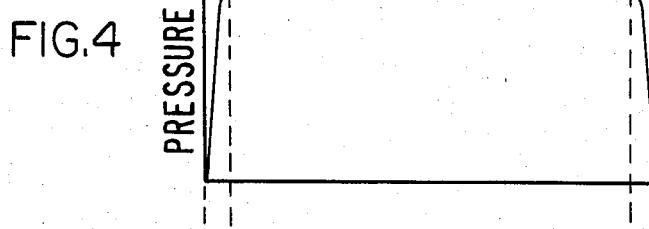
FIG. 4 is a curve showing the gas pressure behind the wafer held in the apparatus of the present invention.

Plate 12 has a lip 18 around its periphery against which a semiconductor wafer 20 is held in place by hold down means (not shown), for example, by the clip means shown in FIGS. 2-3 of R. H. Shaw, "Wafer Support Assembly", U.S. Pat. No. 4,306,731. Inside lip 18, a series of openings 19 permit gas to be introduced to the region 21 immediately behind a semiconductor wafer 20. Due to the proximity of the openings 19 to lip 18, gas is necessarily introduced adjacent the only place in the system where gas leakage may occur, e.g., where gas may leak inadvertently into a vacuum system or where gas might be deliberately introduced into a sputtering system to provide a portion of the sputtering gas. In the latter case gas is introduced through microscopic passages present between the wafer and the lip. Such passages are always present between two hard surfaces placed together unless specific means are provided to seal the surfaces as in valve or flange technology. Since there are no leakage points in the interior of plate 12 and no other internal sources, the gas pressure behind plate 12 is uniform and drops off across lip 18 as shown in FIG. 4 whose data as well as that of FIG.'s 3 and 5 is shown in registration with the regions on the apparatus providing the data. The rate of flow of gas through channel 16 and thus through openings 19 in plate 12 is controlled by an external valve (not shown). The uniform pressure produced across the expanse of the backside of wafer 20 by the apparatus of the present invention (FIG. 4) is sharply contrasted with the pressure profile in prior art gas conduction apparatus as shown in FIG. 3 where gas is introduced centrally.

Figure 5:
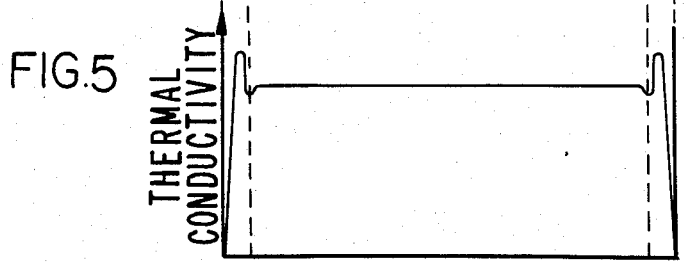
FIG. 5 is a figure showing the thermal conductivity between the plate and the wafer of FIG. 2.

The result of the peripheral introduction of gas and uniform pressure of the present invention is a thermal conductivity through the gas between plate 12 and wafer 20 as shown in FIG. 5. The result is obtained due to the relationship between gas pressure and thermal conductivity as discussed in Section 1.10, "Thermal Conductivity at Low Pressures" in S. Dushman, et al., Scientific Foundations of Vacuum Technique, pp. 43-53 (1962). The thermal transfer rate of uniform across the central expanse of the wafer; in practice, temperature profiles which are uniform to within several percent have been obtained. The thermal transfer rate rises in the middle of lip 18 as an additive contribution is experienced due to the much reduced spacing between the wafer and plate 12. Finally the thermal transfer rate drops to zero as the outside edge of lip 18 is approached since the gas pressure drops to zero.

The selection of a heating or cooling mode is made by energizing resistive heating unit 6, in the first instance, or by turning resistive heating element 6 down and allowing the cooling from flange 22 to predominate in the second instance. In the heating mode the additive contribution near the edge of the wafer helps to compensate for the locally increased radiative heat losses due to radiation from the outer edge 7 of the wafer 20. This compensation minimizes the temperature non-uniformity at the periphery of the wafer and is a significant improvement over the prior art. Typically, the wafer 20 has a larger diameter than lip 18 in order to allow edge 17 to overhang. Thus, even if wafer 20 is presented to thermal treatment apparatus 10 off center the edge 17 will not itself rest on lip 18 and expose lip 19 to the process being carried out.

What is claimed is:

1. Apparatus for the uniform temperature regulation of a substrate by gas conduction, said apparatus comprising:

a body having a substantial thermal mass which serves to provide heat transfer in respect to a substrate, said body having wall means forming an end face, said end face having an annular substrate-support lip projecting outwardly from said end face at a position remote from a center of said end face, whereby when a substrate is positioned against said lip, a chamber is formed by the surfaces of the end face, supporting lip and substrate, said end face having gas conduction aperture means positioned in an annular locus located adjacent an inner rim of said lip, and said end face being solid everywhere internally of said aperture means, said body having gas conduction passage means for conducting gas to said aperture means of said end face, whereby when a substrate is positioned against said lip, gas can be introduced into said chamber to conduct heat from one to the other of said end face and a substrate, and means for controlling temperature of said body, said temperature controlling means being distinct from contact with said gas.

2. Apparatus as claimed in claim 1 wherein said temperature controlling means is cooling means.

3. Apparatus as claimed in claim 1 wherein said temperature controlling means is heating means.

4. Apparatus as claimed in claim 1 wherein said wall means forming said end face comprises a first plate having one side forming said end face and a second plate adjacent the other side on said first plate, one of said plates being recessed to provide a portion of said gas conduction passage means for transmitting gas to said aperture means in said first plate.

5. Apparatus as claimed in claim 1 wherein said end face forms the inner end of said body and said body has an outer end wall opposite said end face, and said temperature controlling means comprises an electrical heater mounted on the outer surface of said outer end wall.

6. Apparatus of claim 1 in combination with a substrate positioned in contact with said lip, said substrate having an outer dimension which is larger than the outer dimension of said lip.

7. Apparatus as claimed in claim 1 wherein said temperature controlling means comprises cooling flange means attached to said body and provided with internal passage means for flow of cooling fluid, and electrical heating means mounted in low thermal resistance contact with said body.

8. Apparatus as claimed in claim 7 wherein said body has a generally cup-shaped portion, said flange means being attached to the outside of the side wall of said cup-shaped portion, and said electrical heating means being mounted on the bottom wall of said cup-shaped portion on the side thereof facing the open end of said cup-shaped portion.

9. A method for uniform temperature regulation of a substrate, said method comprising:

positioning a substrate in contact with a raised peripheral lip of a thermally conductive plate such that a space for gas is provided between said plate and said substrate, flowing gas into said space through an annular locus of aperture means adjacent to the inside of said lip, and controlling the temperature of said thermally conductive plate, whereby gas in said space conducts heat from one to the other of said plate and said substrate, said temperature controlling being distinct from contact with said gas.

10. Apparatus of claim 1 in combination with a substrate having an outer periphery which is larger than the inner periphery of said lip, means for positioning said substrate in contact with said lip, and said contact between said lip and said substrate being such as to provide a leakage path for gas to flow out of said chamber.

11. A method for providing uniform gas pressure against a substrate, said method comprising:

positioning a substrate relative to wall means having and end face such that a space for fluid is provided between said end face and said substrate and a leakage path for said fluid exits between an annular peripheral portion of said end face and the corresponding annular portion of said substrate, flowing a gas into said space around an annular path adjacent to the inside of said leakage path, and permitting said gas to leak outwardly from said space across said leakage path, whereby substantially constant pressure of gas exists across the face of the substrate in the area inside the inner periphery of said leakage path.

12. An apparatus for providing uniform gas pressure against a substrate comprising:

wall means having an end face with annular substrate-support lip projecting outwardly from said end face at a position remote from a center of said end face, whereby when a substrate is positioned against said lip, a chamber is formed by the surfaces of said end face, supporting lip and substrate, and whereby a leakage path for a gas formed between said lip and a corresponding annular portion of said substrate, and a multiplicity of gas conduction aperture means positioned in an annular locus adjacent an inner rim of said lip, said end face being solid everywhere internally of said aperture means.

* * * * *